(12) United States Patent
Paradis et al.

(10) Patent No.: US 12,134,291 B2
(45) Date of Patent: Nov. 5, 2024

(54) SYSTEMS, METHODS, AND APPARATUS FOR CHECKING ELECTRICAL CONNECTION OF A TRAILER WITH A VEHICLE

(71) Applicant: Toyota Motor Engineering & Manufacturing North America, Inc., Plano, TX (US)

(72) Inventors: Alexander L Paradis, Ann Arbor, MI (US); Frank A Richards, Ann Arbor, MI (US)

(73) Assignees: TOYOTA JIDOSHA KABUSHIKI KAISHA (JP); TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 103 days.

(21) Appl. No.: 17/837,974

(22) Filed: Jun. 10, 2022

(65) Prior Publication Data

US 2023/0398824 A1  Dec. 14, 2023

(51) Int. Cl.
  *B60D 1/64* (2006.01)
  *B60Q 1/30* (2006.01)

(52) U.S. Cl.
  CPC ............... *B60D 1/64* (2013.01); *B60Q 1/305* (2013.01)

(58) Field of Classification Search
  CPC ............. B60D 1/64; B60D 1/62; B60Q 1/305
  See application file for complete search history.

(56) References Cited

U.S. PATENT DOCUMENTS

| 7,643,271 | B2 | 1/2010 | Phillips et al. |
| 9,434,308 | B2 | 9/2016 | Bean |
| 9,783,099 | B1* | 10/2017 | Delucco ............. H01R 13/7175 |
| 10,035,392 | B2 | 7/2018 | Ghannam et al. |
| 2015/0137961 | A1* | 5/2015 | Bean ..................... G01R 31/007 340/431 |
| 2017/0353104 | A1* | 12/2017 | Soldner .................. H02H 9/041 |
| 2020/0298642 | A1 | 9/2020 | Arakelian et al. |
| 2021/0354521 | A1* | 11/2021 | Slade ..................... B62D 63/08 |

FOREIGN PATENT DOCUMENTS

AU        2017228514        3/2018

* cited by examiner

*Primary Examiner* — Alvaro E Fortich
(74) *Attorney, Agent, or Firm* — Snell & Wilmer LLP

(57) ABSTRACT

A system for checking or verifying an electrical connection of a trailer with a vehicle. The system includes a first connector integrated with the vehicle, one or more light sources on the vehicle each configured to emit a light ray of one or more colors, and a controller. The first connector includes a plurality of first wires configured for providing power for one or more electrical components on or within the trailer when the first connector integrated with the vehicle is connected to a second connector integrated with the trailer. The controller is configured to determine whether each one of the one or more electrical components on or within the trailer is working and control, based on the determination, the one or more light sources such that each one of the one or more light sources emits a light ray of one of the one or more colors.

17 Claims, 10 Drawing Sheets

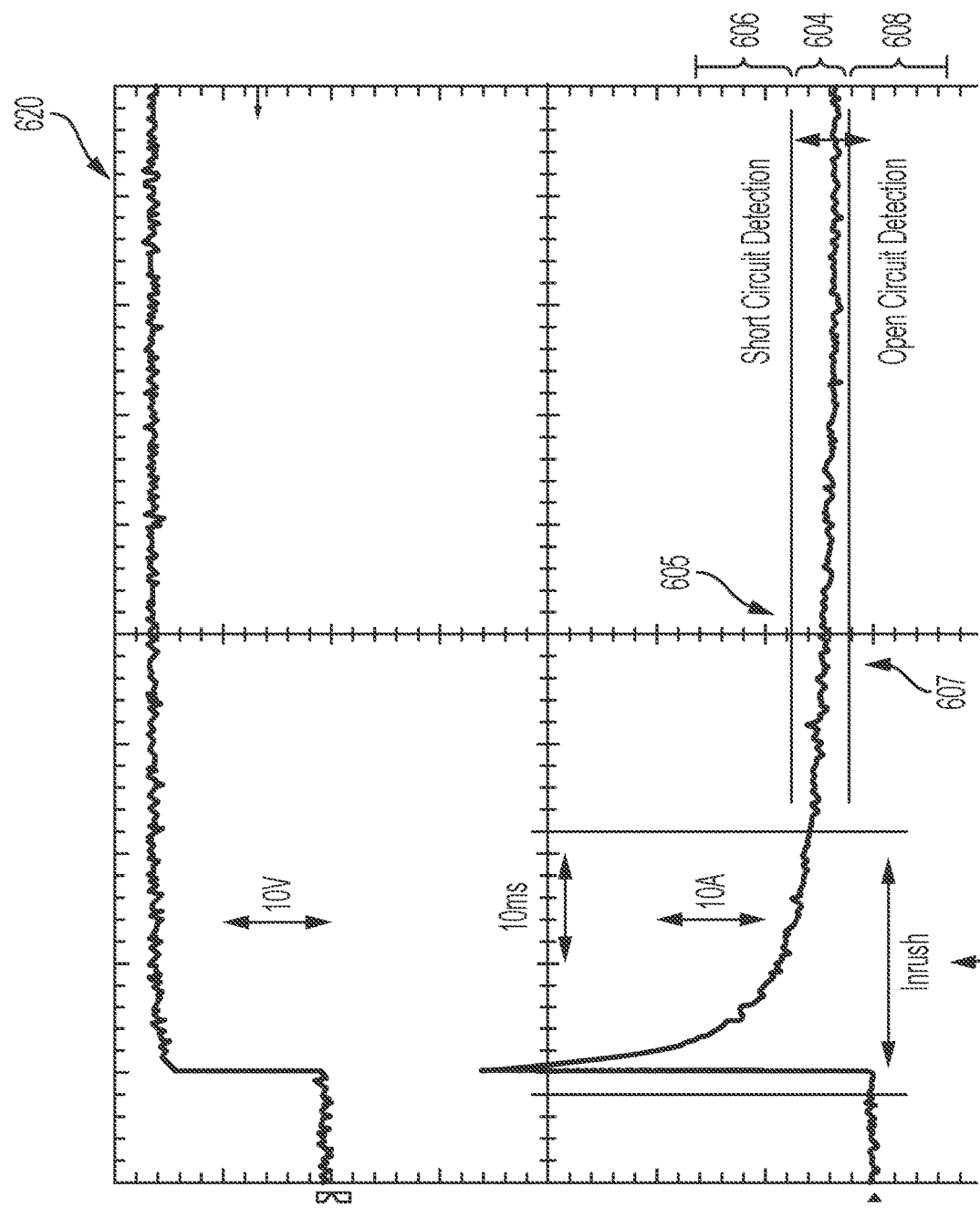

SYSTEMS, METHODS, AND APPARATUS FOR CHECKING ELECTRICAL CONNECTION OF A TRAILER WITH A VEHICLE

BACKGROUND

Field

The present disclosure is directed to systems, methods, and apparatus for checking or verifying electrical connection of a trailer with a vehicle.

Description of the Related Art

Traditionally, there are various ways of checking status of electrical or electronic functions of conventional electronic devices. There are devices that check current, voltage, impedance, and/or the like on a wire or line that transfers electricity for the electrical functions to work properly. For example, a combination meter in an instrument panel (e.g., functioning as an ammeter, a voltmeter, etc.) on a vehicle may check current along a wire for, e.g., a turn signal light to check if the turn signal light is working properly (e.g., based on a measurement of the current along the wire and a comparison of the measured current with an expected level of current). If the measured current is too low, there may be an open circuit condition, and if the measured current is too high, there may be a short circuit condition.

For a vehicle driver (e.g., of a vehicle with a connected trailer), it is important to check for various electrical and electronic functions (e.g., related to various light functions such as turn signal lights, brake lights, etc.) on the trailer because, e.g., having malfunctioning lights, especially of the connected trailer, may give rise to various safety risks and/or hazards. For example, if a turn signal light or a brake light on the trailer is not functioning properly because of a connection issue between the vehicle and the trailer and/or any issue with the light apparatus itself (e.g., a broken light bulb filament), another vehicle following or near the vehicle with the connected trailer may not be able to notice any sudden movement(s) of the vehicle with the connected trailer such as, for example, a sudden lane change and/or a sudden slow-down or stop. These types of circumstances may lead to various safety risks and/or hazards including vehicle collisions, etc. because a driver in the following vehicle may not have enough time to react to the sudden lane change and/or slow-down or stop since the driver in the following vehicle had no notice of the sudden lane change and/or slow-down or stop (i.e., because there was no warning from a working turn signal and/or a working brake light).

Conventionally, after connecting a trailer to a vehicle, a driver may perform a manual check for each electrical or electronic function (e.g., a turn signal light, a stop light, etc.) or use an external device to perform the check. However, such a task may require added time and effort and/or an additional device to carry around, which may lead some driver(s) away from performing the check (i.e., instead, taking on an unnecessary risk associated with any malfunctioning electrical or electronic function on or within the trailer). In some cases, a driver may not even have the means (e.g., an external equipment or an additional passenger) to check all the electrical or electronic functions.

Based on, e.g., the foregoing potential propensity for skipping the check for the electrical or electronic functions on or within the connected trailer and/or the potential lack of resource to perform the check, a more convenient and efficient way to check the electrical or electronic functions of the connected trailer is desirable. Hence, there is a need for advanced systems, methods, and apparatus for checking or verifying electrical connection of a trailer with a vehicle.

SUMMARY

Described herein is a system for checking or verifying one or more electrical connections of a trailer with a vehicle. The system includes a first connector. The first connector is integrated with the vehicle and includes a plurality of first wires configured for providing power for one or more electrical components on or within the trailer when the first connector integrated with the vehicle is connected to a second connector integrated with the trailer. The system also includes one or more light sources. The one or more light sources are integrated with or attached to the vehicle and are each configured to emit a light ray of one or more colors each indicating a status of the one or more electrical connections of the trailer with the vehicle. The system further includes a controller connected to the first connector and the one or more light sources. The controller is configured to determine whether each one of the one or more electrical components on or within the trailer is working. The controller is also configured to control, based on the determination of whether each one of the one or more electrical components on or within the trailer is working, the one or more light sources such that each one of the one or more light sources emits a light ray of one of the one or more colors.

In some embodiments, the determination of whether each one of the one or more electrical components on or within the trailer is working includes a determination of whether a prescribed level of an electrical current flow is detected on a respective one of the plurality of first wires when the first connector integrated with the vehicle is connected to the second connector integrated with the trailer and a corresponding one of the one or more electrical components on or within the trailer is activated. In some implementations, the controller is further configured to control the one or more light sources such that at least one of at least one of the one or more light sources emits a light ray of a first color based on a determination that the first connector integrated with the vehicle is connected to the second connector integrated with the trailer, the at least one of the one or more light sources emits a light ray of a second color based on a determination that the prescribed level of the electrical current flow is detected on the respective one of the plurality of first wires to indicate each one of the one or more electrical components on or within the trailer is working, or the at least one of the one or more light sources emits a light ray of a third color based on a determination that the prescribed level of the electrical current flow is not detected on the respective one of the plurality of first wires to indicate at least one of the one or more electrical components on or within the trailer is not working. The first color may be yellow, the second color may be green, and/or the third color may be red.

In some embodiments, the determination of whether each one of the one or more electrical components on or within the trailer is working includes a transmission, from a power source connected to the controller, of an electrical current on a respective one of the plurality of first wires to activate each one of the one or more electrical components on or within the trailer. The determination of whether each one of the one or more electrical components on or within the trailer is working also includes a detection, by a current sensor connected to the controller and the plurality of first wires, of a level of the electrical current on the respective one of the plurality of first wires. The determination of whether each one of the one or more electrical components on or within the trailer is working further includes a verification of whether each one of the one or more electrical components on or within the trailer is activated. Still further, the determination of whether each one of the one or more electrical components on or within the trailer is working includes a determination, based on the detected level of the electrical current being within a threshold range of electrical current levels and each one of the one or more electrical components on or within the trailer being verified to be activated, that each one of the one or more electrical components on or within the trailer is working.

In some embodiments, the one or more light sources include only one light source. The only one light source may be configured to emit a light ray of a first color based on a determination that the first connector integrated with the vehicle is connected to the second connector integrated with the trailer. The only one light source may also be configured to emit a light ray of a second color when all of the one or more electrical components on or within the trailer are working. The only one light source may further be configured to emit a light ray of a third color when at least one of the one or more electrical components on or within the trailer are not working.

In some embodiments, the one or more light sources include more than one light source each corresponding to a respective one of the one or more electrical components on or within the trailer. Each one of the one or more light sources is configured to emit a light ray of a first color based on a determination that the first connector integrated with the vehicle is connected to the second connector integrated with the trailer. Each one of the one or more light sources is also configured to emit a light ray of a second color when a corresponding one of the one or more electrical components on or within the trailer is working. Each one of the one or more light sources is further configured to emit a light ray of a third color when the corresponding one of the one or more electrical components on or within the trailer is not working.

In some embodiments, the system further includes a user interface connected to the controller and configured to at least one of receive a user input indicative of a request to sequentially activate the one or more electrical components on or within the trailer, or output information related to whether each one of the one or more electrical components on or within the trailer are working.

Also described herein is an apparatus for checking or verifying one or more electrical connections of a trailer with a vehicle. The apparatus includes a first connector. The first connector is integrated with the vehicle and includes a plurality of first wires configured for providing power for one or more electrical components on or within the trailer when the first connector integrated with the vehicle is connected to a second connector integrated with the trailer. The apparatus also includes one or more light sources. The one or more light sources are integrated with or attached to the vehicle and are each configured to emit a light ray of one or more colors each indicating a status of the one or more electrical connections of the trailer with the vehicle. The apparatus further includes a controller connected to the first connector and the one or more light sources. The controller is configured to determine whether each one of the one or more electrical components on or within the trailer is working. The controller is also configured to control, based on the determination of whether each one of the one or more electrical components on or within the trailer is working, the one or more light sources such that each one of the one or more light sources emits a light ray of one of the one or more colors.

In some embodiments, the apparatus further includes a memory configured to store profile data including information related to a threshold range of electrical current levels associated with each one of the one or more electrical components on or within the trailer.

In some embodiments, the apparatus further includes one or more sensors configured to detect sensor data related to at least one of an ambient temperature, an ambient humidity, or an altitude of a location of the vehicle. The controller may be further configured to determine, based on the sensor data, a threshold range of electrical current levels associated with each one of the one or more electrical components on or within the trailer. The controller may also be configured to detect a level of electrical current on each one of the plurality of first wires when a corresponding one of the one or more electrical components on or within the trailer each connected to the respective one of the plurality of first wires is activated. The controller may further be configured to verify, based on the detected level of electrical current on each one of the plurality of first wires being compared with the determined threshold range of electrical current levels associated with each one of the one or more electrical components on or within the trailer, whether each one of the one or more electrical components on or within the trailer is working.

In some embodiments, the one or more light sources include a single light source. The single light source is configured to emit a light ray of a first color based on a determination that the first connector integrated with the vehicle is connected to the second connector integrated with the trailer. The single light source is also configured to emit a light ray of a second color when all of the one or more electrical components on or within the trailer are working. The single light source is further configured to emit a light ray of a third color when at least one of the one or more electrical components on or within the trailer are not working. The single light source may be an LED light source capable of emitting multiple colors from a single LED bulb.

In some embodiments, the one or more light sources include more than one light source each corresponding to a respective one of the one or more electrical components on or within the trailer. Each one of the one or more light sources is configured to emit a light ray of a first color based on a determination that the first connector integrated with the vehicle is connected to the second connector integrated with the trailer. Each one of the one or more light sources is also configured to emit a light ray of a second color when a corresponding one of the one or more electrical components on or within the trailer is working. Each one of the one or more light sources is further configured to emit a light ray of a third color when the corresponding one of the one or more electrical components on or within the trailer is not working.

In some embodiments, the one or more electrical components on or within the trailer include at least one of a left turn signal, a right turn signal, a left brake light, a right brake light, one or more tail lights, one or more reverse lights, one or more license plate lights, a position light, or a side marker light.

In some embodiments, the controller is further configured to perform a training process. The training process includes an activation, by a power source connected to the controller, of each one of the one or more electrical components on or within the trailer. The training process also includes a filtering of an inrush current associated with the activated each one of the one or more electrical components on or within the trailer. The training process further includes a detection, by a current sensor connected to the controller, of a steady state current level on a corresponding one of the plurality of first wires connected to the activated each one of the one or more electrical components on or within the trailer. Still further, the training process includes a verification of whether the activated each one of the one or more electrical components on or within the trailer is working. Moreover, the training process includes a determination, based on the detected steady state current level being within a threshold range of electrical current levels and the activated each one of the one or more electrical components on or within the trailer being verified to be working, that the threshold range of electrical current levels is a correct threshold range for each one of the one or more electrical components on or within the trailer. Furthermore, the training process includes a storage of the threshold range of electrical current levels as being associated with each one of the one or more electrical components on or within the trailer.

Also described herein is a method for checking or verifying one or more electrical connections of a trailer with a vehicle. The method includes providing a first connector integrated with the vehicle and including a plurality of first wires configured for providing power for one or more electrical components on or within the trailer when the first connector integrated with the vehicle is connected to a second connector integrated with the trailer. The method also includes determining, by a controller connected to the first connector, whether each one of the one or more electrical components on or within the trailer is working when the first connector integrated with the vehicle is connected to the second connector integrated with the trailer. The method further includes controlling, by the controller and based on the determining of whether each one of the one or more electrical components on or within the trailer is working, one or more light sources integrated with or attached to the vehicle and connected to the controller such that each one of the one or more light sources emits a light ray of one of one or more colors each indicating a status of the one or more electrical connections of the trailer with the vehicle.

In some embodiments, the method further includes detecting, by a current sensor connected to the controller, a level of current flow on each one of the plurality of first wires. The method also includes determining, by the processor, whether the detected level of current flow satisfies a respective threshold condition including a range of expected current levels. The determining of whether each one of the one or more electrical components on or within the trailer is working includes determining whether the detected level of current flow on each one of the plurality of first wires satisfies the respective threshold condition. In some implementations, the detecting of the level of current flow includes filtering out an inrush current measurement and detecting a steady state current level. In some implementations, the respective threshold condition includes a threshold condition associated with at least one of an ambient temperature value or a system voltage value. In some implementations, the method may further include detecting, by a temperature sensor connected to the controller, a current ambient temperature. The method may also include predicting or determining, by the controller and based on the current ambient temperature, a respective second range of expected current levels associated with each one of the one or more electrical components, the respective second expected range of current levels being different from the range of expected current levels. The determining of whether each one of the one or more electrical components on or within the trailer is working includes determining whether the detected level of current flow on each one of the plurality of first wires is within the respective second range of expected current levels.

BRIEF DESCRIPTION OF THE DRAWINGS

Other systems, methods, features, and advantages of the present invention will be or will become apparent to one of ordinary skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

FIGS. 6A-6C are each a graphical illustration of a current measurement related to a system for checking or verifying electrical connection of a trailer with a vehicle according to an embodiment of the present invention.

DETAILED DESCRIPTION

Figure 1:
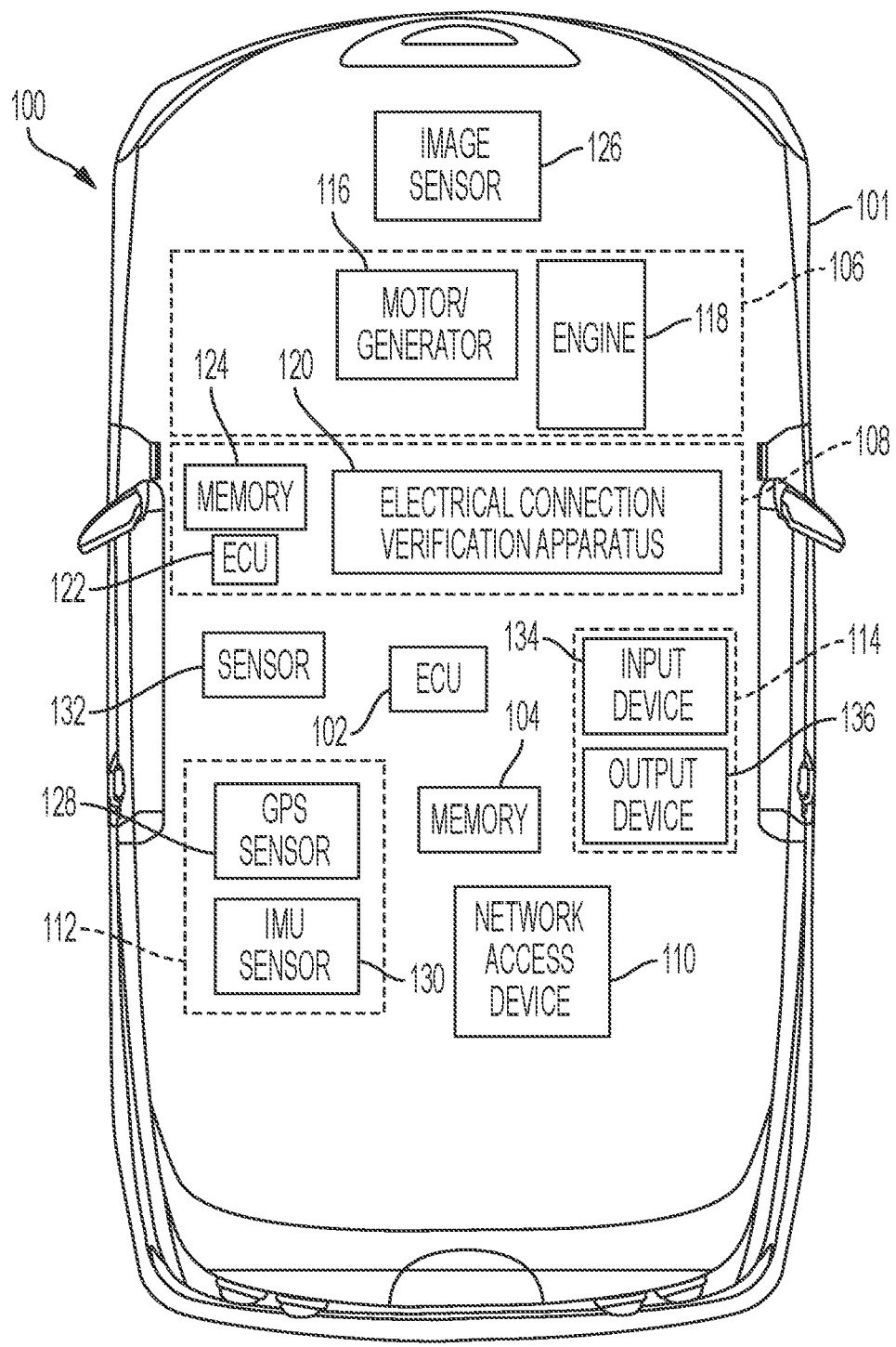
FIG. 1 is a block diagram illustrating an example vehicle having a system for checking or verifying electrical connection of a trailer with a vehicle according to an embodiment of the present invention.

Disclosed herein are systems, devices, apparatuses, platforms and/or methods for checking or verifying electrical connection of a trailer with a vehicle. Particular embodiments of subject matter described in this disclosure may be implemented to realize one or more of following advantages and/or benefits.

In some embodiments, a system disclosed herein may provide an illuminated light around or near a trailer connector on a vehicle for a vehicle driver or user to understand if various electrical systems on or within the trailer are functioning properly when connected to and drawing power from the vehicle. Moreover, the system may allow the vehicle driver or user to check functionality of the trailer electrical functions (e.g., one or more turn signals, brake lights, etc.) which can often be difficult when done by oneself—i.e., without any assistance from, e.g., a second person or an additional equipment. The disclosed system may also alert the vehicle driver or user regarding the checked/verified trailer electrical functions on a user interface (e.g., an in-dash display, an infotainment system, and/or the like).

Furthermore, the system disclosed herein may advantageously allow the vehicle driver or user to "train" his or her vehicle to recognize correct functionality of each electrical circuit that is plugged into the trailer electrical connection. In various embodiments, each of electrical loads of pins plugged into a vehicle may be unique. When a trailer is connected to a vehicle for the first time (i.e., a first activation), the system described herein may enter a training mode (e.g., to be shown on an instrument panel or a dash on or within the vehicle or a user interface on a remote device such as a mobile device (e.g., a smartphone, a tablet, or the like which may be used to run a software program application to provide a user interface with the disclosed system)). The system may then cycle through all the electrical functions of the trailer (as powered by the vehicle via a connector between the trailer and the vehicle) and measure a current through each electrical connection pin. The measured current values (e.g., with respective margins) may be saved to a memory (e.g., on the vehicle and/or a remote device).

For any subsequent instance of plugging in the electrical connector integrated with the same trailer into the vehicle after the training is completed, the vehicle driver or user may simply put the vehicle (or a system thereon) into a checking mode and connect the trailer connector on the vehicle with the electrical connector integrated with the trailer. In various embodiments, the system may activate an indicator light, e.g., on or within the vehicle (e.g., a ring-shaped light source (or a light source with a ring-shaped cover) around or near a trailer connector on the vehicle) and/or an icon on a screen of a user interface that indicates or displays whether the electrical functions of the trailer are functioning properly (or whether there is a fault, for example). The vehicle driver or user may thereby be able to have near instantaneous feedback on whether the electrical connections between the vehicle and the trailer are working properly without, e.g., having to do another manual check with another person or any additional equipment, because the electrical functions may be activated and the associated current levels may be compared against the current values saved in the memory for verification of the working electrical connection.

As but one example, the ring-shaped light source around or near the connector on the vehicle may emit one of one or more colors (e.g., three colors)—for example, a first color (e.g., yellow) right after the trailer connector on the vehicle is connected to the electrical connector integrated with the trailer and while the check or verification of the working electrical connection is ongoing; a second color (e.g., green) after the check is completed and if the check yields OK results for all the connected electrical functions; and a third color (e.g., red) if there is any issue with one or more electrical functions (e.g., a turn signal or stop light bulb or LED (Light Emitting Diode) not working properly). The display on the user interface may also be updated to indicate the detected status. In some embodiments, the ring-shaped light source may also have multiple segments to directly identify each corresponding electrical component to indicate which pin (i.e., which electrical component) is not working properly. While the ring-shaped light source is described herein, it would be apparent to one of ordinary skill in the art that any shape may work with the various embodiments discussed herein without departing from the scope or spirit of the present disclosure.

The system described herein may also enable an automatic checking (i.e., after the system has been trained) of electrical pin functionality of a trailer electrical connection. In various embodiments, the system may automatically (and without a need for any additional equipment or personnel) check for open, short, or the like conditions for each of the pins. Thus, the disclosed system can make it less likely that a driver may drive without checking the electrical connection of a trailer with a vehicle and being informed about whether there is any issue with the electrical system—thereby increasing overall safety in driving a vehicle with a connected trailer. That is, the easier and more efficient automatic checking of the electrical connection of the trailer with the vehicle may allow the vehicle driver or user to conduct the verification of the electrical connection more easily and readily—making it less likely that the vehicle driver or user skips the checking before driving the vehicle with the connected trailer. The checking process and the connection status readily available to the vehicle driver or user can give him or her a peace of mind when driving the vehicle with the connected trailer.

Turning to FIG. 1, a system 100 for checking or verifying electrical connection of a trailer with a vehicle is illustrated. The system 100 may include a vehicle 101 configured for verifying one or more electrical connections of a trailer with the vehicle 101. The system 100 (and/or the vehicle 101) may include an ECU (electronic control unit) 102, a memory 104, a torque source 106, and an electrical connection verification system 108. The system 100 (and/or the vehicle 101) may further include a network access device 110, an image sensor 126, a location sensor 112, and a sensor 132. Moreover, the system 100 (and/or the vehicle 101) may also include an input device 134 and an output device 136, which together may be referred to as a user interface 114.

In some embodiments, the vehicle 101 (i.e., its main body) may be propelled along a roadway. The main body of the vehicle 101 may resemble a vehicle such as a car, a bus, a sport utility vehicle (SUV), a truck, or the like and support one or more individuals such as a driver, a passenger, or the like. Furthermore, the vehicle 101 may include a vehicle cabin (not shown) in which the driver, the passenger, or the like may be located.

The ECU 102 may be coupled to each of various components of the system 100 and/or the vehicle 101 and may include one or more processors or controllers which may be specifically designed and programmed for automotive systems. In various embodiments, the ECU 102 may include a control software, hardware, or the like which is communicatively coupled to one or more of the various components of the system 100 and/or the vehicle 101 including, e.g., the electrical connection verification system 108, the user interface 114, etc. and configured to control one or more operations of the connected components. The functions of the ECU 102 may be implemented in a single ECU or in multiple ECUs. For example, the ECU 102 may include a torque ECU (not shown) that controls the torque source 106, a user interface ECU (not shown) that controls the user interface 114, or the like. The ECU 102 may receive data from one or more of the components of the system 100 and/or the vehicle 101, may make determinations based on the received data, and may control the operations of the one or more of the components of the system 100 and/or the vehicle 101 based on the determinations. For example, the ECU 102 may receive a brake request from a brake pedal (not shown), may determine a brake operation based on the received brake request, and may cause one or more components of a brake system to be actuated so as to, e.g., slow down or stop movement of the vehicle 101. In some embodiments, the request may be based on a user input received via the user interface 114 or the network access device 110 (e.g., a transceiver). In various embodiments, the ECU 102 may include or cooperate with other ECU(s) and/or controller(s) discussed herein to determine one or more actions (e.g., related to checking or verifying an electrical connection of a trailer with a vehicle).

The ECU 102 may be included in the system 100 and include or couple to one or more processors. These one or more processors may be implemented as a single processor or as multiple processors. For example, the ECU 102 may include a microprocessor, a data processor, a microcontroller, or other controller, and may be coupled to some or all of the other components within the system 100. The functions of the ECU 102 may be implemented in a single controller or in multiple controllers.

The vehicle 101 may be non-autonomous, fully autonomous, or semi-autonomous. In that regard, the ECU 102 may control various aspects of the system 100 and/or the vehicle 101 (such as steering, braking, accelerating, or the like) to maneuver the vehicle 101 from a starting location to a destination location. In some embodiments, the vehicle 101 may be operated in an autonomous, semi-autonomous, or fully driver-operated state. In that regard, the vehicle 101 may be operated independently of driver control and, from time to time, without a person inside of the vehicle 101. The ECU 102 may facilitate the autonomous functionality.

The memory 104 may include any non-transitory memory and may store data usable by the ECU 102 and may be coupled to the ECU 102. The memory 104 may be located in or on the vehicle 101 and may be referred to as a local memory. In some embodiments, the memory 104 may be located remote from the vehicle 101 and may be referred to as a remote memory. The memory 104 may be a combination of the local memory and the remote memory in various embodiments. Furthermore, the memory 104 (as well as any other memory which is described herein and/or not specifically discussed but may be used with any system or apparatus described herein) may include one or more of RAM (Random Access Memory) or other volatile or non-volatile memory. The memory 104 may be a non-transitory memory or a data storage device, such as a hard disk drive, a solid-state disk drive, a hybrid disk drive, or other appropriate data storage, and may further store machine-readable instructions, which may be loaded and executed by the ECU 102. In some embodiments, the various types of data stored on the memory 104 may be stored in various types of data structures and formats—the memory 104 may store a database, a data store, or the like.

As shown, the electrical connection verification system 108 may include an electrical connection verification apparatus 120, an electrical connection verification system ECU 122 (also referred to as a system ECU 122 herein), and an electrical connection verification system memory 124 (also referred to as a system memory 124 herein). The electrical connection verification apparatus 120 may include one or more components configured to enable the checking and/or verification of the electrical connection of a trailer with the vehicle 101, including, e.g., one or more connections to one or more wires and/or pins included in a connector or outlet on or integrated with the vehicle 101 to which a connector integrated with the trailer may be connected. The apparatus 120 may include or be connected to, e.g., a power source which may provide the power necessary to cause one or more electrical functions on or within the trailer to work when activated (when the vehicle 101 and the trailer are connected electrically), and/or one or more meters (e.g., functioning as an ammeter, a voltmeter, or the like) configured to measure current flowing through the one or more wires included in the connector integrated with the vehicle 101 when providing power to the one or more connected electrical functions on or within the trailer.

The system ECU 122 may be coupled to each component of the electrical connection verification system 108 and may include one or more processors or controllers which may be specifically designed and programmed for automotive systems. The functions of the system ECU 122 (e.g., a dedicated ECU for the electrical connection verification system 108) may be implemented in a single ECU or in multiple ECUs. The system ECU 122 may monitor and/or control the electrical connection verification system 108 to, e.g., determine whether various electrical components of the trailer (e.g., a turn signal, a brake light, etc.) are working. In some embodiments, the system ECU 122 may cooperate with the ECU 102 (or any other ECU on or within the system 100 or the vehicle 101) or solely operate to control the electrical connection verification system 108.

In some embodiments, the electrical connection verification system 108 may include a non-transitory system memory 124 that may be the same as or separate from the memory 104. The system memory 124 may store data usable by the system ECU 122 to monitor and/or control operations of the electrical connection verification system 108.

In various embodiments, the torque source 106 may include one or more of an engine 118 or a motor-generator 116. The ECU 102 may monitor and/or control operation of the torque source 106 (including the engine 118 and/or the motor-generator 116), and the ECU 102 and/or the system ECU 122 may monitor and/or control operation of the electrical connection verification system 108 (e.g., including the electrical connection verification apparatus 120).

The engine 118 may convert fuel into mechanical power for propelling the vehicle 101. In that regard, the engine 118 may be a gasoline engine, a diesel engine, an ethanol engine, or the like. Optionally, the vehicle 101 may not include the engine 118 and may be an electric vehicle with the motor-generator 116.

The motor-generator 116 may convert, e.g., electrical energy stored in an energy storage device (not shown; the energy storage device may store the electrical energy and include one or more energy storage devices including a battery, a flywheel, a super capacitor, a thermal storage device, or the like) or received directly from, e.g., a fuel-cell circuit (not shown; the fuel-cell circuit may include a plurality of fuel cells (e.g., one or more fuel cell stacks) that facilitate a chemical reaction to generate electrical energy along with a system or systems for providing hydrogen and oxygen (or any other compounds)) into mechanical power usable to propel the vehicle 101. The motor-generator 116 may further convert mechanical power received from the engine 118 or from wheels of the vehicle 101 into electricity, which may be stored in the energy storage device (not shown) as energy and/or used by other components of the vehicle 101. In some embodiments, the motor-generator 116 may include a motor without a generator portion, and, in some embodiments, a separate generator may be provided.

The location sensor 112 may include any sensor capable of detecting data corresponding to a location of the vehicle 101. For example, the location sensor 112 may include one or more of a global positioning system (GPS) sensor 128, an inertial measurement unit (IMU) sensor 130, or the like. The GPS sensor 128 may detect data corresponding to a location of the vehicle 101. For example, the GPS sensor 128 may detect global positioning coordinates of the vehicle 101. The IMU sensor 130 may include one or more of an accelerometer, a gyroscope, or the like. The IMU sensor 130 may detect inertial measurement data corresponding to a position, a velocity, an orientation, an acceleration, or the like of the vehicle 101. The inertial measurement data may be used to identify a change in location of the vehicle 101, which the ECU 102 may track in order to determine the location of the vehicle 101.

The image sensor 126 may be connected to the main body of the vehicle 101 and may detect image data corresponding to an environment of the vehicle 101, data corresponding to a vehicle cabin (not shown), or the like. For example, the image sensor 126 may include a camera, a RADAR (Radio Detection and Ranging) detector, a LIDAR (Light Detection and Ranging) detector, or any other image sensor capable of detecting light having any wavelength. The image sensor 126 may include one or multiple image sensors which may be oriented to detect image data in any direction relative to the main body of the vehicle 101 (and/or within the vehicle cabin). For example, the image sensor 126 may include four or more RADAR detectors to detect RADAR data on four or more sides of the main body of the vehicle 101. The image sensor 126 may also or instead include a first camera to detect image data in a forward direction relative to the main body of the vehicle 101 and a second camera to detect image data in a rear direction relative to the main body of the vehicle 101. In various embodiments, the image sensor 126 may be utilized to detect one or more landmarks to determine a location of the vehicle 101.

The sensor 132 may include one or more sensors capable of detecting a status of a vehicle component or a surrounding environment of the vehicle 101. For example, the sensor 132 may include a voltage sensor, a current sensor, a power sensor, an SOC (state of charge) sensor, or the like coupled to the ECU 102. In some embodiments, the sensor 132 may also detect data corresponding to a surrounding environment of the vehicle 101 including, e.g., a temperature, a humidity level, etc. of the surrounding environment of the vehicle 101.

In various embodiments, the system 100 may utilize one or more of the location sensor 112, the image sensor 126, and/or the sensor 132 in order to detect sensor data related to a surrounding environment and/or a location (e.g., an ambient temperature and/or a geographical location) of the vehicle 101, and the system 100 may utilize the sensor data to determine any impact of the surrounding environment and/or the location of the vehicle 101 on a current level (e.g., a threshold range of current levels) associated with one or more electrical functions of a trailer connected to the vehicle 101.

The input device 134 may include one or more input devices such as a button, a keyboard, a mouse, a touchscreen, a microphone, or the like. The input device 134 may receive input from a user of the vehicle 101 such as a driver or a passenger. The input device 134 may receive, for example, information corresponding to a request for cruise control, information usable to control an auxiliary component of the vehicle 101 (e.g., to control a navigation device or a stereo), or the like. In some embodiments, the input device 134 may include additional input device(s) usable to control the vehicle 101 such as an accelerator pedal, a brake pedal, a steering wheel, or the like. The input device 134 may also or instead receive information corresponding to a request for the vehicle 101 to drive autonomously. Moreover, in some embodiments, the input device 134 may include a button (e.g., a physical button near a connector integrated with the vehicle 101 for connecting a trailer and/or a "soft" button on a user interface such as a touchscreen display) for initiating a training mode for checking the electrical connections of the trailer with the vehicle 101 (e.g., for automatically and/or sequentially activating each turn signal light, each brake light, etc., and/or manually advancing through a series of menus included in the training mode), as described further herein. In some embodiments, the input device 134 may be a physical button located near the connector integrated with the vehicle 101 for making an electrical connection with the trailer and configured for initiating the training mode. In various embodiments, the input device 134 may include additional input device(s) usable to control the system 100 or the vehicle 101 by manually controlling one or more operations described herein.

The output device 136 may include any output device such as a speaker, a display, a touchscreen, or the like. The output device 136 may output data to a user of the vehicle. The output device 136 may, for example, output information relating to status of the electronic connection of the trailer with the vehicle 101 as described herein.

In some embodiments, the user interface 114 including the input device 134 and/or the output device 136 may be disposed on or within the vehicle 101 and thus be a local user interface. In some embodiments, the user interface 114 may be available on a remote device such as, e.g., a mobile device of a driver or user. The remote device such as the mobile device may allow the driver or user to carry the device with him or her during the training mode for and/or the checking or verifying of the electrical connection of the trailer with the vehicle 101. For example, the driver or user may run a software program application on the mobile device which may allow the driver or user to access the information regarding the training mode for and/or the checking or verifying of the electrical connection of the trailer with the vehicle 101. The remote device such as the mobile device may be in data communication with the vehicle 101 via the network access device 110 to exchange data related to the training mode for and/or the checking or verifying of the electrical connection of the trailer with the vehicle 101. In some embodiments, the user interface 114 may be a user interface device attached to or integrated with an apparatus included in the system 100 or the vehicle 101 (e.g., an infotainment button system or the like). In some embodiments, the user interface 114 may be a user interface available on a remote device such as, e.g., a smartphone, a tablet, or the like which may be connected to the system 100 or the vehicle 101 via wire or wirelessly. For example, the network access device 110 may be utilized to establish a wireless connection between the system 100 including the ECU 102 and the remote device including the user interface 114. The wireless connection may be provided by any type of wireless connection known in the art such as, for example, Bluetooth, Wi-Fi, a cellular network, etc.

The network access device 110 may include any network access device capable of communicating via a communications protocol (e.g., a wireless protocol). For example, the network access device 110 may include a transceiver and communicate via Bluetooth, Wi-Fi, a cellular protocol, vehicle to vehicle (V2V) communications, Zigbee, or any other communications (e.g., wireless) protocol. The network access device 110 may be referred to as a data communication module (DCM) and may communicate with any device on the vehicle 100 and/or any remote device. Furthermore, the network access device 110 may include a communication port or channel, such as one or more of a Wi-Fi unit, a Bluetooth unit, an RFID tag or reader, or a cellular network unit for accessing a cellular network (such as a 3GPP 4G or 5G network, or the like). The network access device 110 may transmit data to and receive data from devices and systems not directly connected to the system 100 or the vehicle 101, for example.

Figure 2A:
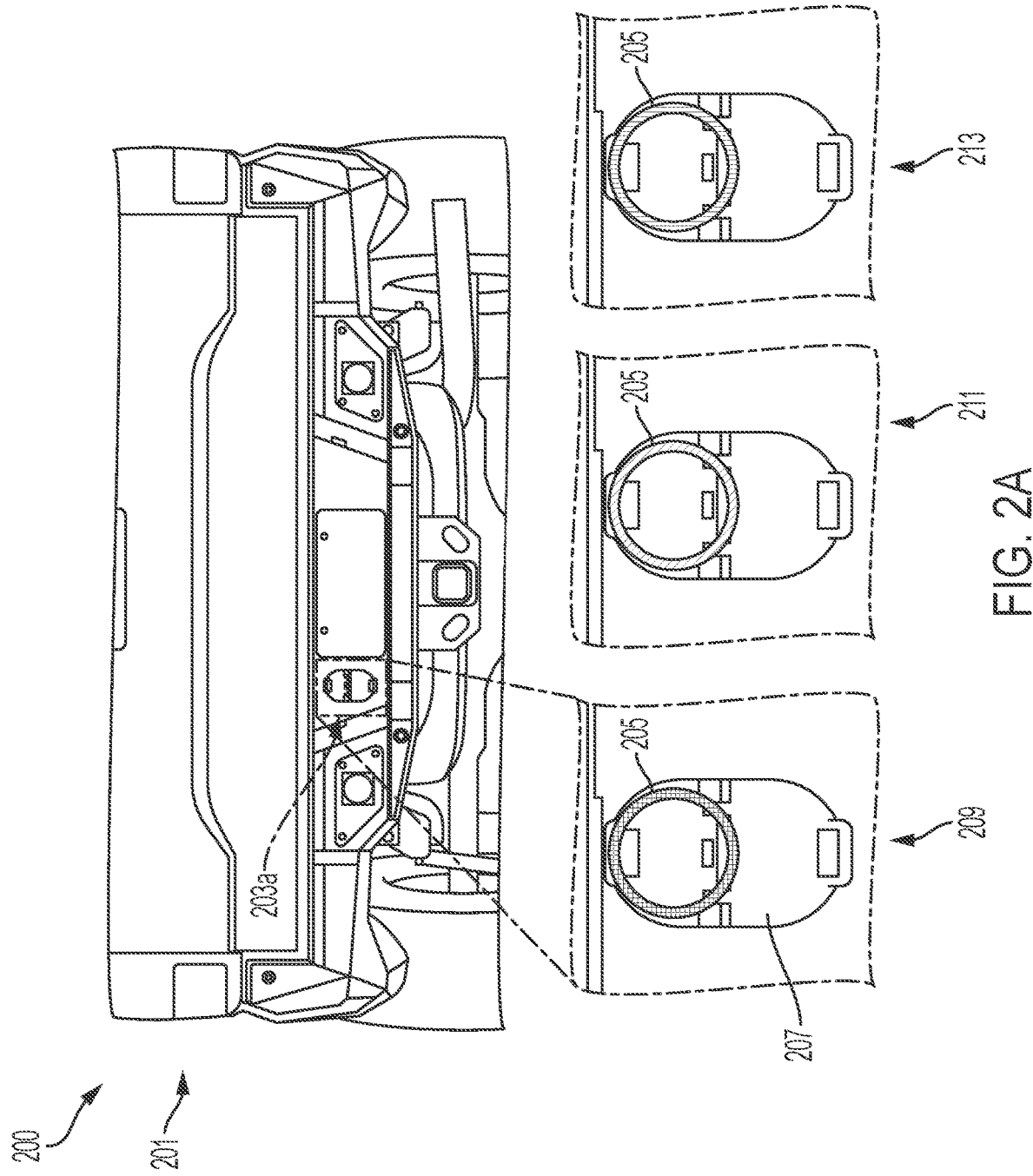
FIGS. 2A-2C are each an illustration of an example system for checking or verifying electrical connection of a trailer with a vehicle according to an embodiment of the present invention.
Figure 2B:
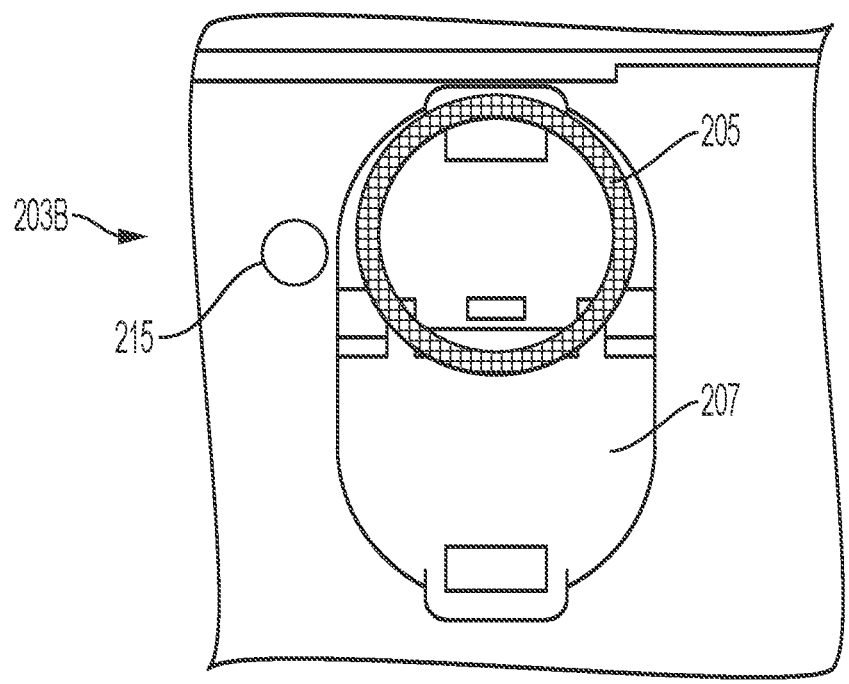
Figure 2C:
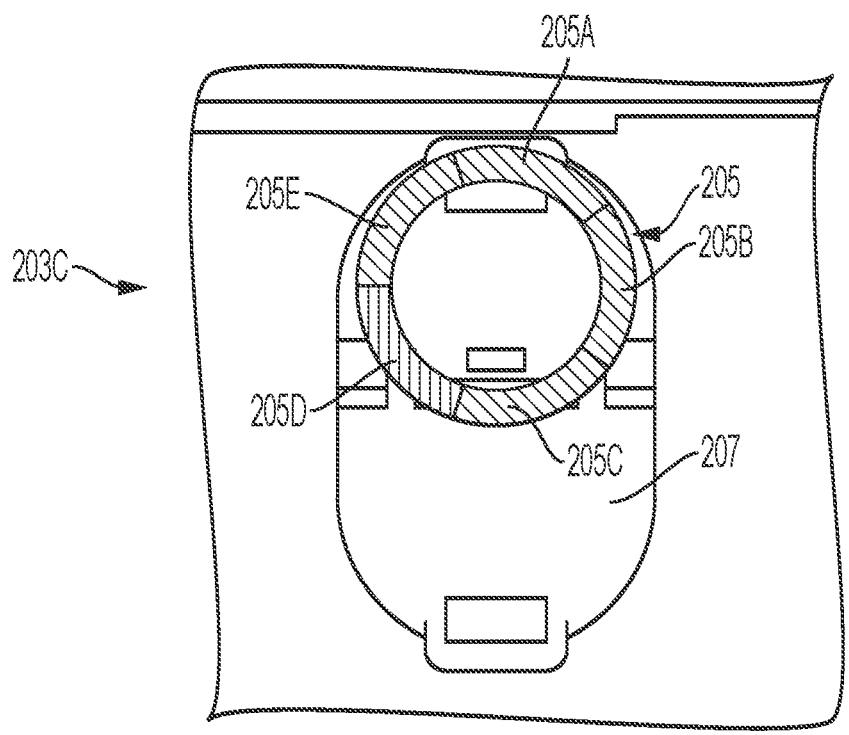

Now turning to FIGS. 2A-2C, various example illustrations of a system 200 (including a connector apparatus 203A-C which may be on or integrated with the vehicle 201) for checking or verifying electrical connection of a trailer with a vehicle is shown. Referring to FIG. 2A, the system 200 may include a vehicle 201 and the connector apparatus 203A integrated on or within an external surface of the vehicle 201. For example, the connector apparatus 203A may be integrated on a rear surface (e.g., near a tail gate of a pick-up truck and facing rearward—where a trailer may be connected from) of the vehicle 201. The connector apparatus 203A may include an external light source 205 (e.g., on or within the vehicle 201) and a cover 207 and include wiring or a plurality of pins for making an electrical connection with a trailer. Various example configurations of the connector apparatus 203A related to the electrical connection with, e.g., the trailer are described further herein with reference to FIG. 5.

In some embodiments, the external light source 205 may be ring-shaped (or of any other shape as would be apparent to one of ordinary skill in the art) and located near or around where a connector integrated with a trailer may be connected to the connector apparatus 203A when the trailer is connected with the vehicle 201. In some embodiments, a color of a light ray emitted from the external light source 205 may be one of one or more colors (e.g., a first color, a second color, or a third color). In some embodiments, a light ray of a given color may be emitted to signal a particular condition. For example, a light ray may be emitted only when there is any issue with the electrical connection between the trailer and the vehicle 201 or only when there is no issue with the electrical connection between the trailer and the vehicle 201. In another example, a light ray of the first color (e.g., yellow) may indicate that the vehicle 201 (or the system 200) is checking the electrical connections, that a connection between the trailer and vehicle 201 has been made (i.e., before any electrical function has been activated, but to signal, e.g., a start of a training mode), or that the cover 207 is open and the connector apparatus 203A is ready to be connected with the trailer. See example configuration 209. A light ray of the second color (e.g., green) may indicate that all the electrical connections were verified to be working (i.e., a current level measured for each of the electrical connections was within a threshold range of current values). See example configuration 211. A light ray of the third color (e.g., red) may indicate that at least one of the electrical connections was not working properly (i.e., the current measured for at least one of the electrical connections when a corresponding electrical function on or within the trailer was activated was not within the threshold range of current values). See example configuration 213.

Referring now to FIG. 2B, in some embodiments, the connector apparatus 203B may include an activation button 215 in addition to the external light source 205 and the cover 207. In various embodiments, the activation button 215 may activate each of the electrical functions on or within the trailer (e.g., automatically and/or sequentially) by providing power to the electrical functions or components on or within the trailer via the electrical connection between the trailer and the vehicle 201. Moreover, the activation button 215 may be located near the connector apparatus 203B so that it is easily accessible when a driver or user is connecting the trailer to the vehicle 201. In some embodiments, the activation button 215 may be a soft button on a menu available on a user interface (e.g., similar to the user interface 114 described herein with reference to FIG. 1).

Furthermore, as shown in FIG. 2C, in some embodiments, the connector apparatus 203C may include a plurality of segmented light sources 205A-E each configured to emit a light ray of a color of one or more colors—similar to as described with reference to the connector apparatus 203A-B with reference to FIGS. 2A and 2B. In some embodiments, the segmented light sources 205A-E may be oriented such that a position of each one indicates a position of a wire or pin inside the electrical connection between the trailer and the vehicle 201 and/or a particular electrical function on the trailer such as, e.g., a turn signal, a brake light, or the like.

Figure 3A:
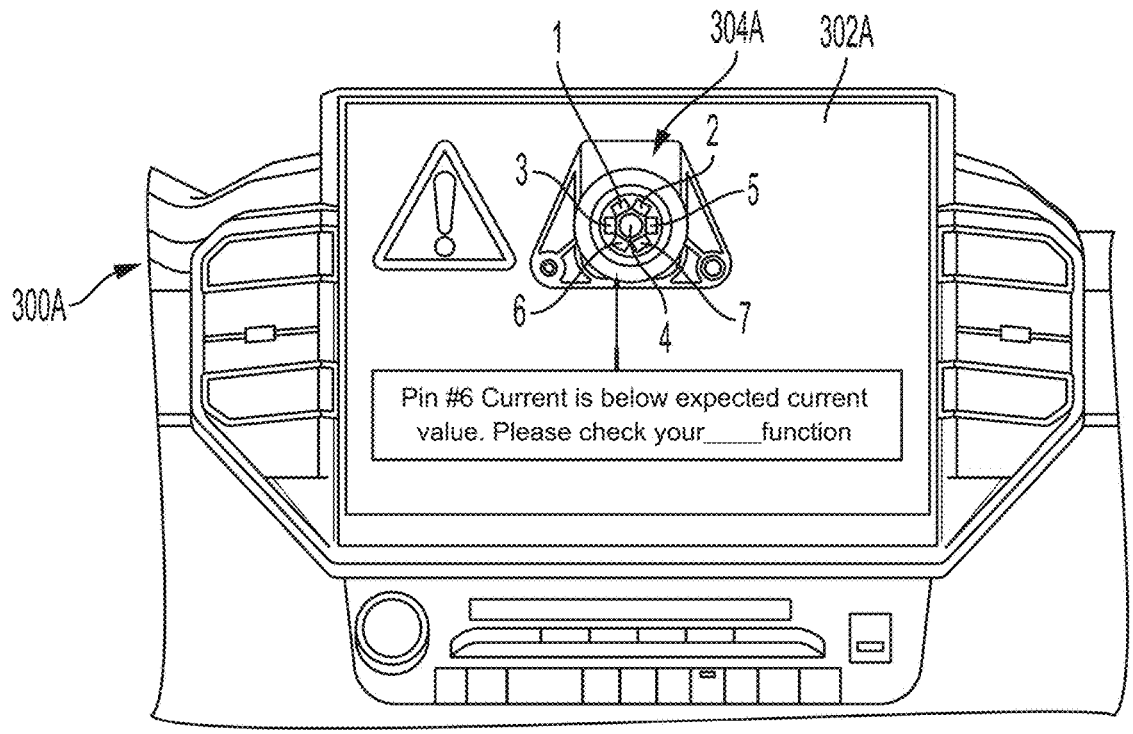
FIGS. 3A and 3B are each an illustration of an example user interface of a system for checking or verifying electrical connection of a trailer with a vehicle according to an embodiment of the present invention.
Figure 3B:
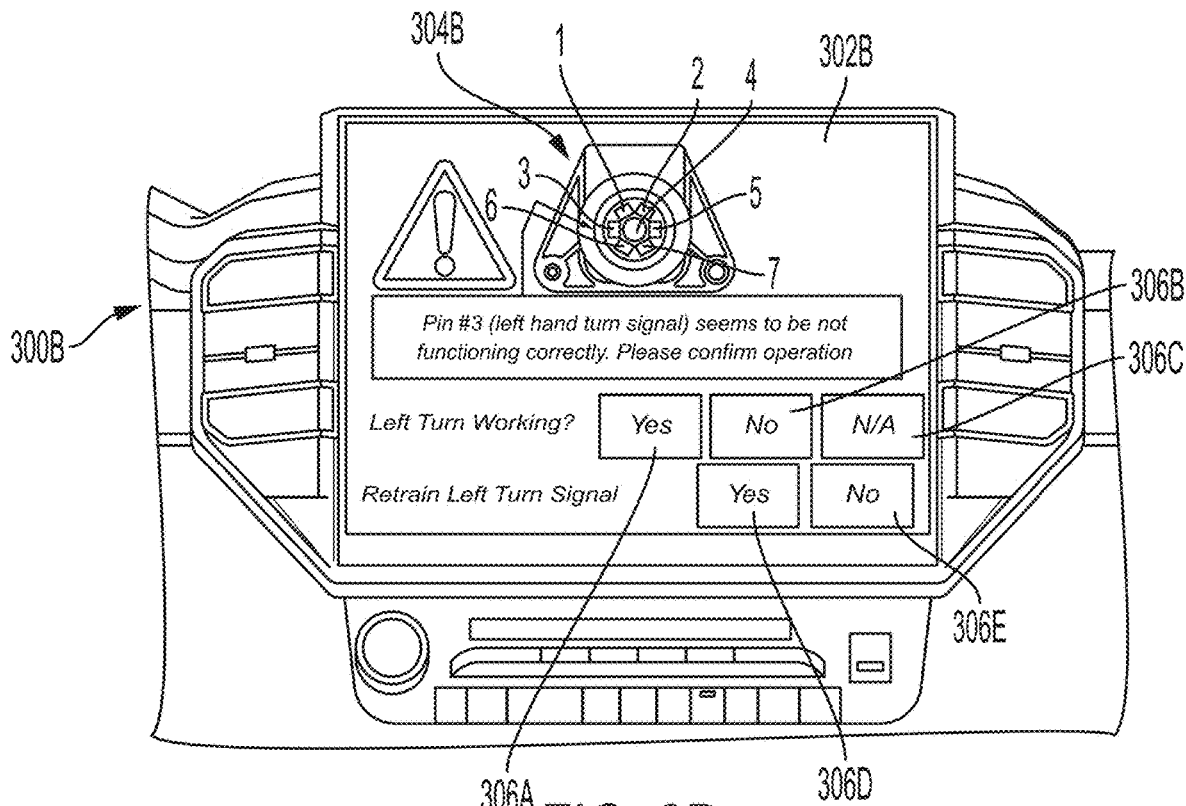

FIGS. 3A and 3B are each an illustration of an example user interface 300A-B (e.g., similar to the user interface 114 described herein with reference to FIG. 1) of a system for checking or verifying electrical connection of a trailer with a vehicle. In particular, FIG. 3A illustrates an example of the user interface 300A including an output device (e.g., similar to the output device 136 described herein with reference to FIG. 1) such as a display that may be part of an infotainment system in a vehicle. The user interface 300A may display a menu 302A which indicates a progress or result of the electrical connection verification training or process described herein. As shown, the menu 302A may include a graphical illustration of a connector and its wires/pins—which, in some embodiments, may mimic an actual shape and/or look of the actual connection.

In various embodiments, the portions 304A and 304B indicating the wires/pins included in a connector may be differently colored on the menu 302A (and 302B) to indicate the different electrical functions on a trailer connected to the vehicle (see FIGS. 3A and 3B). In some embodiments, the wires/pins may be labeled by numbers 1-7, and each numbered area associated with a corresponding wire/pin may display one of one or more colors (e.g., a first color, a second color, or a third color), depending on the progress and/or result of the electrical connection verification as described herein with reference to FIGS. 2A-2C. Moreover, the menu 302A (and 302B) may include a text or image which may include additional detail(s) relating to, e.g., a pin that is not working properly and/or an instruction to verify the related electrical functionality on or within the trailer connected to the vehicle. In some embodiments, the menu 302A (and 302B) may also be accompanied by a warning indicator (as shown) and/or an alert sound (not illustrated).

FIG. 3B illustrates another example of the user interface 300B including an input device and an output device (e.g., similar to the input device 134 and the output device 136 described herein with reference to FIG. 1) such as a display that may be rendered as part of an infotainment system including, e.g., a touch screen, in a vehicle. In some embodiments, the user interface 300B may include a touch screen and/or a display which may show a menu 302B and be controlled by a controller and/or based on user input entered via an input device. The menu 302B may include various components discussed above with reference to FIG. 3A. In some embodiments, the menu 302B may include additional portions including soft buttons 306A-E which may be selected, e.g., by a touch screen or the like to provide a user input regarding various portions of the menu 302B. For example, the menu 302B may include a text or image for asking a driver or user whether a particular electrical function is working properly (or whether it is applicable/supported). The menu 302B may further include a text for asking whether the electrical connection system may be re-trained. That is, if the electrical connection system detects that a particular electrical function is not working properly, a driver or user may indicate as such on the menu 302B by entering his or her input via an input device such as, e.g., a touch screen included in the user interface 300B and also provide a confirmation for an instruction to re-train an electrical function. As a brief aside, the training and/or the re-training of an electrical function on or within the trailer may include an activation of the electrical function from the vehicle connected to the trailer and measuring a steady state current level of the electrical function when activated. The steady state current level refers to a current level that is measured after a period of time during which an inrush current is observed. The steady state current and the inrush current are described further herein with reference to FIGS. 6A-C.

Turning back to FIG. 3B, in some embodiments, the verified electrical function on or within the trailer may be re-trained when, e.g., while the measured current may have been determined to be out of an expected range, the actual electronic function or component on or within the trailer may be verified to be working properly (e.g., by visual inspection). The change in the observed current level may be due to, e.g., the vehicle and the trailer being located at a different location than when the original threshold range of current levels was determined. For example, a different surrounding condition (e.g., a different temperature, a different humidity level, etc.) may contribute to the different current behavior.

Figure 4:
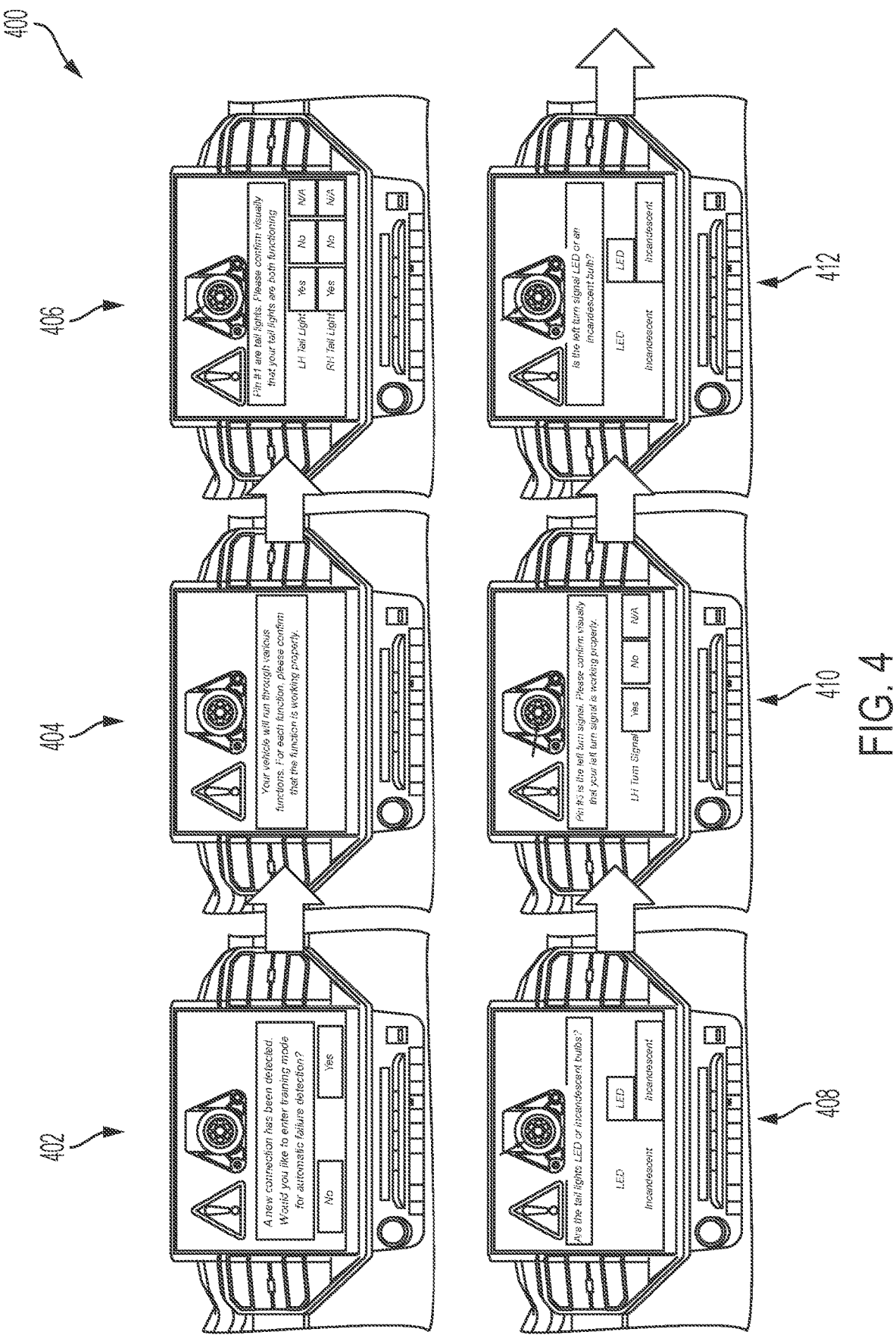
FIG. 4 is an illustration of an example flow of menus shown on a user interface of a system for checking or verifying electrical connection of a trailer with a vehicle according to an embodiment of the present invention.

FIG. 4 is an illustration of an example flow 400 of menus shown on a user interface of a system for checking or verifying electrical connection of a trailer with a vehicle. As shown, in step 402, a user may be asked whether a training mode may be initiated for an automatic failure detection based on a new electrical connection having been made.

If a user selects "YES" to begin the training mode in step 402, the user may be given an instruction in step 404 that the user's vehicle will run through various electrical functions (e.g., by activating turn signal and brake lights, etc.) on or within the trailer.

For each of the electrical functions, the user may be asked to verify whether the electrical function is working properly and/or if the electrical function is applicable (step 406).

Furthermore, the user may then be asked to identify a light apparatus type of each electrical function being checked (e.g., LED or incandescent light bulb—while only two options are shown in FIG. 4, it would be apparent to one of ordinary skill in the art that other electrical apparatus type(s) may be applicable and available as options) (step 408).

The selection of the light apparatus type may enable the electrical connection verification system to automatically determine, e.g., an applicable range of current levels to enable the system to be trained to recognize whether a correct amount of current is flowing when the electrical function is working.

Then, a same process as steps 406 and 408 may be repeated for other electrical functions on the trailer (steps 410 and 412).

In some embodiments, if the user selects "NO" to skip the training mode, the electrical connection verification may automatically and sequentially run through each of the electrical functions on or within the trailer to verify whether each of the electrical functions on or within the trailer is working properly by comparing a measured current level with a previously-stored or default threshold current range that may be based on a previous completion of the training or a default value based on a type of light apparatus selected.

Figure 5:
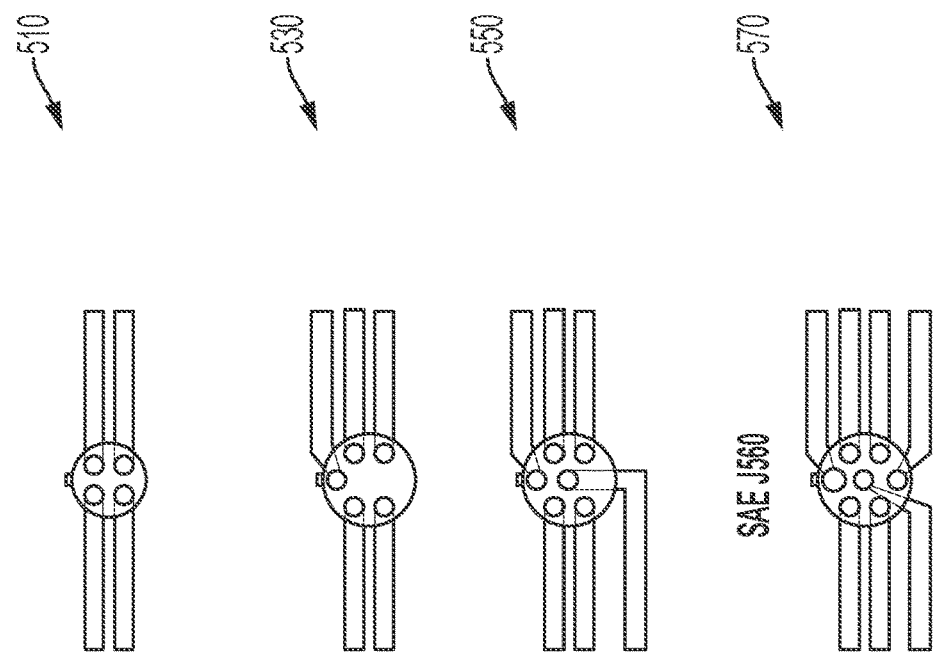
FIG. 5 is an illustration of various example electrical connections related to a system for checking or verifying electrical connection of a trailer with a vehicle according to an embodiment of the present invention.
Figure 5:
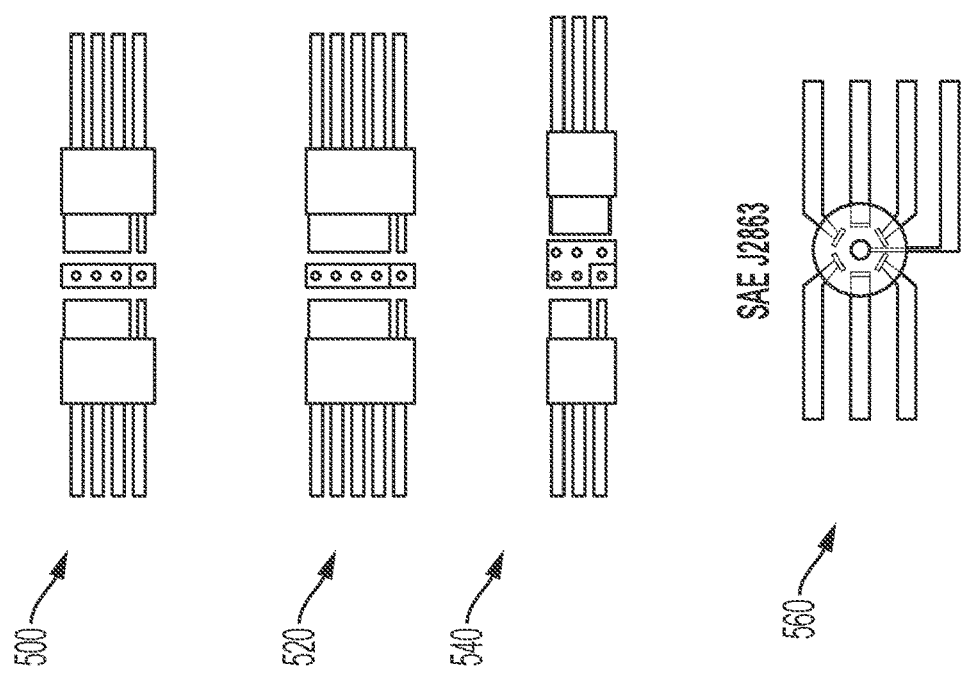

FIG. 5 includes example illustrations related to various types of electrical connections that may be checked between a trailer and a vehicle. The various types of the electrical connection may include a flat 4-pin connector 500, a 4-pin round connector 510, a flat 5-pin connector 520, a 5-pin round connector 530, a 6-pin rectangular connector 540, a 6-pin round connector 550, a 7-pin round blade connector (SAE J2863) 560, a 7-pin trailer connector (SAE J560) 570, and alternate wirings of the SAE J560 connector (e.g., a SAE J560-like, type 1 connector and a SAE J560-like, type 2 connector; not shown). Various electrical functions of a connected trailer which may be checked or verified based on these connectors include: (1) right turn signal, (2) left turn signal, (3) tail lights, (4) reverse lights, (5) license plate light, (6) position or side marker light, (7) right brake light, (8) left brake light, etc. It would be apparent to one of ordinary skill in the art that various implementations of these functions may exist without departing from the scope or spirit of the present disclosure. Moreover, some connectors may provide the electrical connection for more than one electrical function (e.g., a turn signal light and a stop light may be combined such as to be supported by one pin).

Figure 6A:
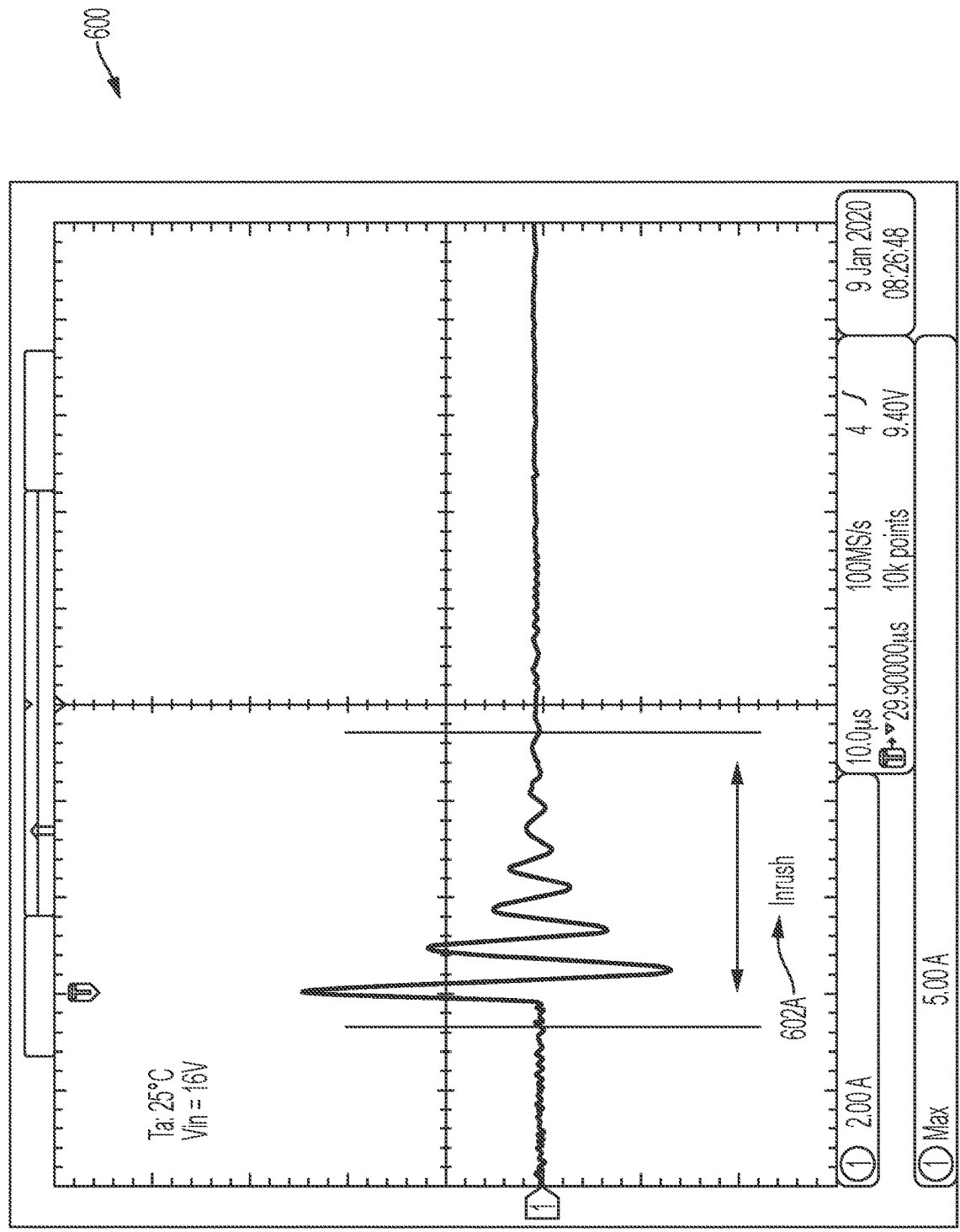
Figure 6B:
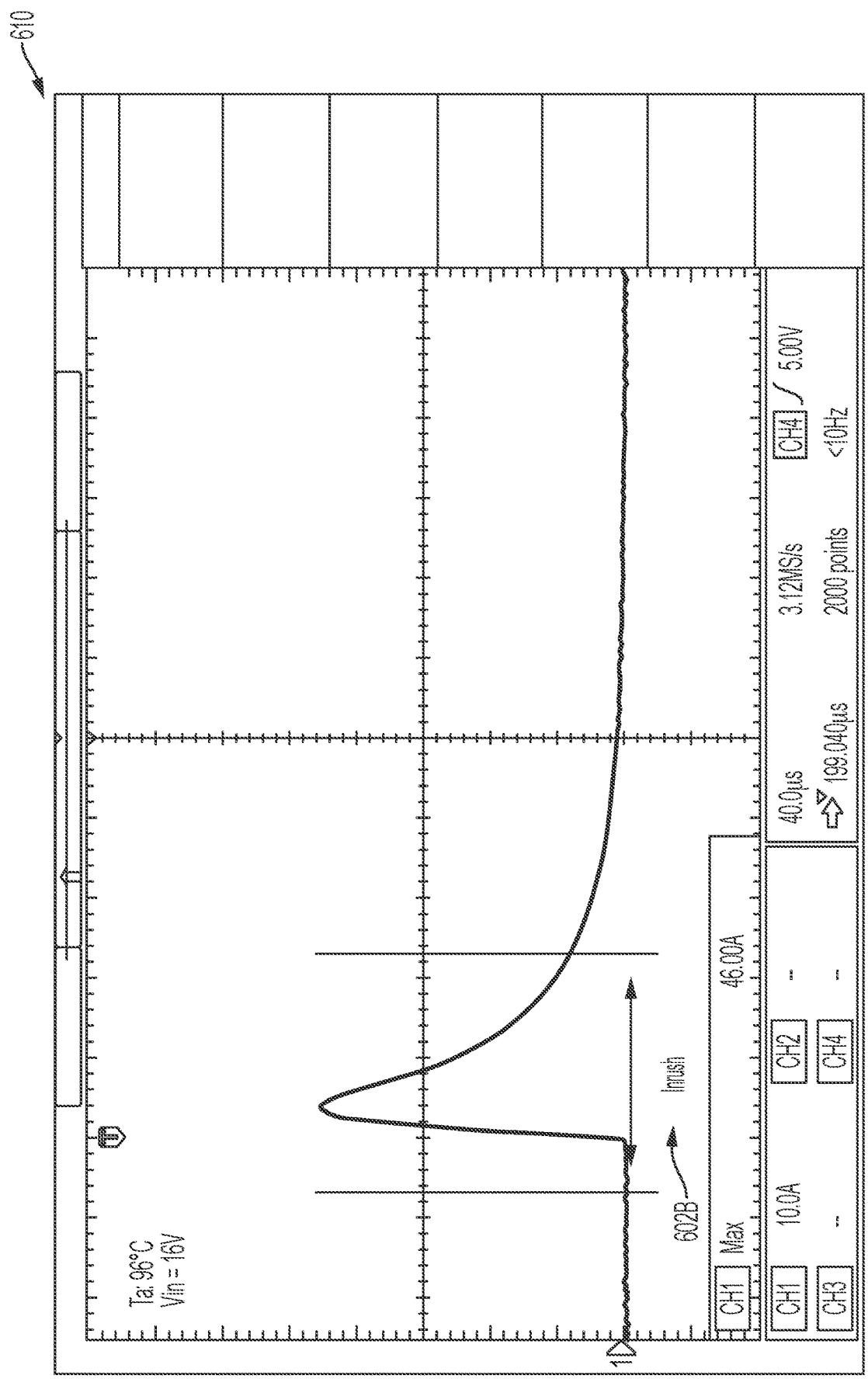

FIGS. 6A-6C are example graphical illustrations of a current measurement on one of the wires (i.e., as included in a connector between a vehicle and a trailer) discussed herein. Each display (i.e., of plots 600, 610, and 620 associated with, respectively, an LED side marker including a single LED, a T20 light bulb, and an LED low beam light including 6 LEDs and showing data observed, e.g., under given conditions indicated by Ta (ambient temperature) and Vin (system or vehicle voltage) as shown for plots 600 and 610) shows a portion corresponding to where an "inrush" current is observed. These plots are illustrative examples related to, respectively, a single LED (FIG. 6A), a light bulb (FIG. 6B), and multiple LEDs (FIG. 6C), and the specific data related to the observed/measured current levels may vary depending on the data capturing/measurement environment and/or settings. That is, varied Ta and/or Vin may affect the actual values (e.g., current values) observed, and an appropriate amount of margin may be added to previously observed values of current levels for determining expected values of current levels with a given Ta and/or a given Vin. For example, if an electrical connection verification system described herein is trained with an ambient temperature of 25° C. (information which may be stored in and accessed from a memory) and a present ambient temperature of the system is (e.g., as detected by one or more sensors as described herein with reference to FIG. 1), the system may execute a logic to predict that the current levels to be measured with the ambient temperature of 40° C. may be higher than the expected values from the training at the ambient temperature of 25° C. by a prescribed margin (i.e., the logic may include predicting or obtaining the expected values of the current levels at a higher or lower ambient temperature and comparing the measured current levels with the predicted or obtained expected values). A similar logic may be performed by the electrical connection verification system described herein for the varied Vin values. As a brief aside, an inrush current (sometimes referred to as input surge current or switch-on surge) is a maximal instantaneous input current drawn by an electrical device when first turned on. Thus, the inrush current may be "ignored" or filtered when determining a steady state current level which is utilized by the system disclosed herein (e.g., the system 100 described with reference to FIG. 1) for determining whether an electric function of a trailer connected to a vehicle is working.

The system disclosed herein may utilize artificial intelligence/machine learning algorithms and/or various data available from, e.g., a cloud service (including crowd-sourced data) to set boundaries (e.g., timing boundaries) for filtering the inrush current and finding upper and lower boundaries for a threshold range of current levels associated with the steady state current. In various embodiments, the boundaries may also be set based on a preset configuration (e.g., manufacturer default value(s)) or manually set by a user (e.g., during training). For example, the plots 600, 610, and 620 show, respectively, time windows 602A-C where the inrush current may be observed. The time windows 602A-C may be different for different LEDs and/or light bulbs, and the time windows 602A-C, in some examples, may be on the order of milliseconds. The disclosed system may learn this timing through a training or learning process and/or data available from a connected memory (local or remote) and ignore or filter out the portion of the measured current level corresponding to the inrush current (e.g., the first 200-500 ms after an electrical function is activated) in order to determine the steady state current level.

Moreover, as shown in the plot 620 of FIG. 6C, the disclosed system may determine various current level ranges (e.g., ranges 604, 606, and 608) which may correspond to, e.g., a threshold range 604 for a steady state current level of a working electrical function, an upper range 606 for a short circuit condition, and a lower range 608 for an open circuit condition. As a brief aside, the short circuit condition refers to a condition wherein an electrical circuit resistance (e.g., from an LED, bulb filament, etc.) has been jumped (i.e., creating an unintended path for the electrical current with no or very low resistance), allowing the electrical current to flow "freely" with little to no resistance. The open circuit condition refers to a condition wherein a disconnection in an electrical circuit (e.g., from a broken bulb filament, etc.) is observed (i.e., creating an infinite level of resistance between two nodes, with no electrical current flow). Referring back to FIG. 6C, the upper range 606 may be defined to include current levels above an upper boundary 605 of current levels, and the lower range 608 may be defined to include current levels below a lower boundary 607 of current levels. These boundaries may be based on, e.g., a type of light apparatus (e.g., LED vs. bulb, etc.) on the trailer as well as other factors including, e.g., a surrounding environment of a vehicle (e.g., ambient temperature, system or vehicle voltage, altitude or location of the vehicle, etc.) which may be detected by various sensors (e.g., the various sensors discussed herein with reference to FIG. 1) and/or retrieved from a memory and cause the boundaries to be adjusted based on the other factors affecting the performance of the vehicle and/or the light functions on a connected trailer. Data relating to the determined boundaries as obtained through the training process described herein as well as usage time of various electrical functions on a trailer (e.g., hours of use of each electrical function) may be stored on a memory connected to the vehicle so that the data may be used for subsequent electrical connections to the trailer (e.g., for checking or verifying the electrical connection) and/or determining if a given electrical function (e.g., an LED or a bulb) may be approaching an end of its expected lifecycle (which may be utilized to, e.g., alert a driver or user that an electrical function such as an LED or a bulb on the trailer may need to be replaced).

Figure 7:
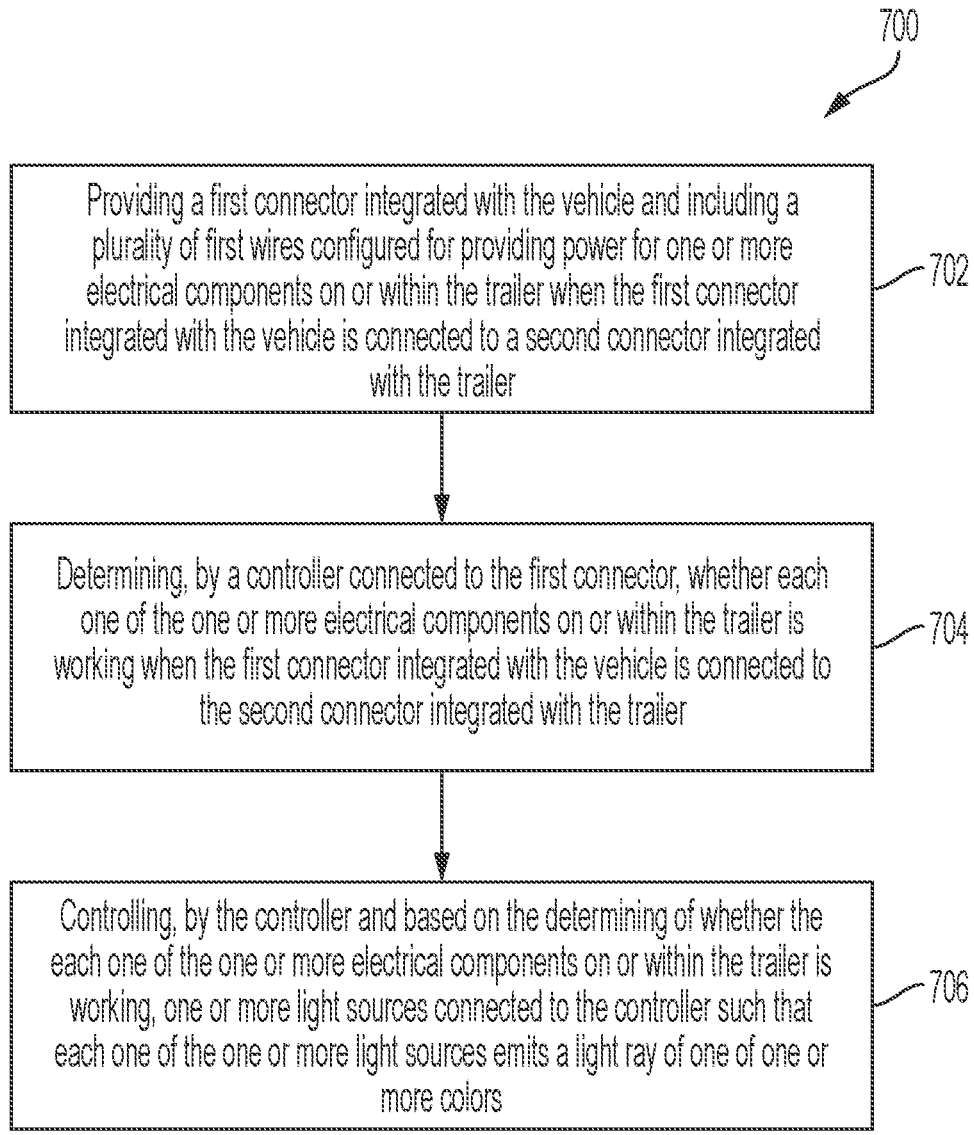
FIG. 7 is a flowchart illustrating a method for checking or verifying electrical connection of a trailer with a vehicle according to an embodiment of the present invention.

FIG. 7 is a flowchart illustrating a method 700 for checking or verifying electrical connection of a trailer with a vehicle. The method 700 includes providing a first connector integrated with the vehicle and including a plurality of first wires configured for providing power for one or more electrical components on or within the trailer when the first connector integrated with the vehicle is connected to a second connector integrated with the trailer (step 702); determining, by a controller connected to the first connector, whether each one of the one or more electrical components on or within the trailer is working when the first connector integrated with the vehicle is connected to the second connector integrated with the trailer (step 704); and controlling, by the controller and based on the determining of whether each one of the one or more electrical components on or within the trailer is working, one or more light sources integrated with or attached to the vehicle and connected to the controller such that each one of the one or more light sources emits a light ray of one of one or more colors each indicating a status of the one or more electrical connections of the trailer with the vehicle (step 706).

Where used throughout the specification and the claims, "at least one of A or B" includes "A" only, "B" only, or "A and B." Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments (e.g., including a singular element where multiple elements are described and/or multiple elements where a singular element is described, etc.) that reasonably fall within the scope of the advancement to the art hereby contributed, and that that scope shall not be restricted, except in light of the appended claims and their equivalents.

What is claimed is:

1. A system for checking or verifying one or more electrical connections of a trailer with a vehicle, the system comprising:
    a vehicle connector integrated with the vehicle and including a plurality of wires configured for providing power for one or more electrical components on or within the trailer when the vehicle connector is connected to a trailer connector integrated with the trailer;
    a current sensor electrically connected to the vehicle connector and configured to detect a level of electrical current through each one of the plurality of wires;
    a temperature sensor configured to detect an ambient temperature of a location of the vehicle;
    one or more light sources integrated with or attached to the vehicle and each configured to emit a light ray of one or more colors each indicating a status of the one or more electrical connections; and
    a controller electrically connected to the vehicle connector, the current sensor, the temperature sensor, and the one or more light sources and configured to:
        determine, via the current sensor, whether the detected level of electrical current is within a range of expected electrical current levels,
        determine or predict, via the temperature sensor, a range of electrical current levels associated with each one of the one or more electrical components based on the detected ambient temperature,
        determine, via the current sensor, whether the detected level of electrical current is within the determined or the predicted range of electrical current levels, and control the one or more light sources such that each one of the one or more light sources emits a light ray of one of the one or more colors based on the determination of whether the detected level of electrical current is within the range of expected electrical current levels or the determined or the predicted range of electrical current levels.

2. The system of claim 1, wherein the determination of whether the detected level of electrical current is within the range of expected electrical current levels includes a determination of whether a prescribed level of an electrical current flow is detected on a respective one of the plurality of wires when the vehicle connector is connected to the trailer connector and a corresponding one of the one or more electrical components on or within the trailer is activated.

3. The system of claim 2, wherein the controller is further configured to control the one or more light sources such that at least one of:
at least one of the one or more light sources emits a light ray of a first color of the one or more colors based on a determination that the vehicle connector is connected to the trailer connector;
the at least one of the one or more light sources emits a light ray of a second color of the one or more colors based on a determination that the prescribed level of the electrical current flow is detected on the respective one of the plurality of wires to indicate the each one of the one or more electrical components on or within the trailer is working; or
the at least one of the one or more light sources emits a light ray of a third color of the one or more colors based on a determination that the prescribed level of the electrical current flow is not detected on the respective one of the plurality of wires to indicate at least one of the one or more electrical components on or within the trailer is not working.

4. The system of claim 3, wherein at least one of:
the first color is yellow;
the second color is green; or
the third color is red.

5. The system of claim 1, wherein the determination of whether the detected level of electrical current is within the range of expected electrical current levels includes:
a transmission, from a power source connected to the controller, of an electrical current through a respective one of the plurality of first wires to activate the each one of the one or more electrical components on or within the trailer;
a detection, by the current sensor, of a level of the electrical current through the respective one of the plurality of first wires; and
a verification of whether the each one of the one or more electrical components on or within the trailer is activated.

6. The system of claim 1, wherein the one or more light sources include only one light source configured to:
emit a light ray of a first color of the one or more colors based on a determination that the vehicle connector is connected to the trailer connector;
emit a light ray of a second color of the one or more colors when all of the one or more electrical components on or within the trailer are working; and
emit a light ray of a third color of the one or more colors when at least one of the one or more electrical components on or within the trailer are not working.

7. The system of claim 1, wherein:
the one or more light sources include more than one light source each corresponding to a respective one of the one or more electrical components on or within the trailer; and
each one of the one or more light sources is configured to:
emit a light ray of a first color of the one or more colors based on a determination that the vehicle connector is connected to the trailer connector,
emit a light ray of a second color of the one or more colors when a corresponding one of the one or more electrical components is working, and
emit a light ray of a third color of the one or more colors when the corresponding one of the one or more electrical components is not working.

8. The system of claim 1, further comprising a user interface connected to the controller and configured to at least one of:
receive a user input indicative of a request to sequentially activate the one or more electrical components on or within the trailer, or
output information related to whether the each one of the one or more electrical components on or within the trailer are working.

9. An apparatus for checking or verifying one or more electrical connections of a trailer with a vehicle, the apparatus comprising:
a first connector integrated with the vehicle and including a plurality of wires configured for providing power for one or more electrical components on or within the trailer when the first connector is connected to a second connector integrated with the trailer;
a current sensor electrically connected to the first connector and configured to detect a level of electrical current through each one of the plurality of wires;
a temperature sensor configured to detect an ambient temperature of a location of the vehicle;
one or more light sources integrated with or attached to the vehicle and each configured to emit a light ray of one or more colors each indicating a status of the one or more electrical connections of the trailer with the vehicle; and
a controller connected to the first connector, the current sensor, the temperature sensor, and the one or more light sources and configured to:
determine whether each one of the one or more electrical components is working based on whether the detected level of electrical current is within a range of expected electrical current levels,
determine or predict, via the temperature sensor, a range of electrical current levels associated with each one of the one or more electrical components based on the detected ambient temperature,
determine whether the each one of the one or more electrical components is working based on whether the detected level of electrical current is within the determined or the predicted range of electrical current levels, and
control, based on the determination of whether the each one of the one or more electrical components is working, the one or more light sources such that each one of the one or more light sources emits a light ray of one of the one or more colors.

10. The apparatus of claim 9, further comprising a memory configured to store profile data including information related to the range of expected electrical current levels, the range of expected electrical current levels including at least one range of electrical current levels associated with the each one of the one or more electrical.

11. The apparatus of claim 9, further comprising one or more sensors configured to detect sensor data related to at least one of an ambient humidity or an altitude of the location of the vehicle; and
the controller is further configured to:
determine, based on the sensor data, a threshold range of electrical current levels associated with the each one of the one or more electrical components,
detect a level of electrical current through the each one of the plurality of wires when a corresponding one of the one or more electrical components each connected to the respective one of the plurality of wires is activated, and
verify, based on the detected level of electrical current through the each one of the plurality of wires being compared with the determined threshold range of electrical current levels associated with the each one of the one or more electrical components, whether the each one of the one or more electrical components is working.

12. The apparatus of claim 9, wherein the one or more light sources include a single light source configured to:
emit a light ray of a first color of the one or more colors based on a determination that the first connector is connected to the second connector;
emit a light ray of a second color of the one or more colors when all of the one or more electrical components are working; and
emit a light ray of a third color of the one or more colors when at least one of the one or more electrical components are not working.

13. The apparatus of claim 9, wherein:
the one or more light sources include more than one light source each corresponding to a respective one of the one or more electrical components; and
each one of the one or more light sources is configured to:
emit a light ray of a first color of the one or more colors based on a determination that the first connector is connected to the second connector,
emit a light ray of a second color of the one or more colors when a corresponding one of the one or more electrical components is working, and
emit a light ray of a third color of the one or more colors when the corresponding one of the one or more electrical components is not working.

14. The apparatus of claim 9, wherein the one or more electrical components on or within the trailer include at least one of a left turn signal, a right turn signal, a left brake light, a right brake light, one or more tail lights, one or more reverse lights, one or more license plate lights, a position light, or a side marker light.

15. The apparatus of claim 9, wherein the controller is further configured to perform a training process including:
an activation, by a power source connected to the controller, of the each one of the one or more electrical components;
a filtering of an inrush current associated with the activated each one of the one or more electrical components;
a detection, by the current sensor, of a steady state current level on a corresponding one of the plurality of wires connected to the activated each one of the one or more electrical components;
a verification of whether the activated each one of the one or more electrical components is working;
a determination, based on the detected steady state current level being within a threshold range of electrical current levels and the activated each one of the one or more electrical components being verified to be working, that the threshold range of electrical current levels is a correct threshold range for the each one of the one or more electrical components; and
a storage of the threshold range of electrical current levels as being associated with the each one of the one or more electrical components-on or within the trailer.

16. A method for checking or verifying one or more electrical connections of a trailer with a vehicle, the method comprising:
providing a vehicle connector integrated with the vehicle and including a plurality of wires configured for providing power for one or more electrical components on or within the trailer when the vehicle connector is connected to a trailer connector integrated with the trailer;
detecting, by a current sensor, a level of current flow through each one of the plurality of wires;
determining, by a controller electrically connected to the vehicle connector and the current sensor, whether the detected level of current flow through the each one of the plurality of wires is within a range of expected current levels;
detecting, by a temperature sensor electrically connected to the controller, a current ambient temperature of a location of the vehicle;
predicting or determining, by the controller, a range of current levels associated with each one of the one or more electrical components based on the current ambient temperature;
determining, by the controller, whether the detected level of current flow through the each one of the plurality of wires is within the predicted or the determined range of current levels; and
controlling, by the controller and based on the determining of whether the detected level of current flow though the each one of the plurality of wires is within the range of expected current levels or the predicted or the determined range of current levels, one or more light sources integrated with or attached to the vehicle and electrically connected to the controller such that each one of the one or more light sources emits a light ray of one of one or more colors each indicating a status of the one or more electrical connections of the trailer with the vehicle.

17. The method of claim 16, wherein the detecting of the level of current flow includes filtering out an inrush current measurement and detecting a steady state current level.

* * * * *